(12) United States Patent
Bisotto et al.

(10) Patent No.: US 8,852,997 B2
(45) Date of Patent: Oct. 7, 2014

(54) METHOD FOR REMOVING RESIDUAL EXTRINSIC IMPURITIES IN AN N TYPE ZNO OR ZNMGO SUBSTRATE, FOR P-TYPE DOPING OF THIS SUBSTRATE

(75) Inventors: Isabelle Bisotto, La Bruguiere (FR); Guy Feuillet, Saint Martin d'uriage (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 40 days.

(21) Appl. No.: 13/701,621

(22) PCT Filed: Jun. 1, 2011

(86) PCT No.: PCT/EP2011/059130
§ 371 (c)(1),
(2), (4) Date: Feb. 14, 2013

(87) PCT Pub. No.: WO2011/151409
PCT Pub. Date: Dec. 8, 2011

(65) Prior Publication Data
US 2013/0137214 A1  May 30, 2013

(30) Foreign Application Priority Data

Jun. 3, 2010 (FR) ..................... 10 54370

(51) Int. Cl.
| | |
|---|---|
| H01L 21/00 | (2006.01) |
| H01L 21/322 | (2006.01) |
| H01L 21/46 | (2006.01) |
| H01L 21/477 | (2006.01) |
| H01L 21/425 | (2006.01) |
| H01L 33/00 | (2010.01) |

(52) U.S. Cl.
CPC ............. *H01L 21/46* (2013.01); *H01L 33/0083* (2013.01); *H01L 21/477* (2013.01); *H01L 21/425* (2013.01)
USPC .......................................... 438/104; 438/473

(58) Field of Classification Search
None
See application file for complete search history.

(56) References Cited

U.S. PATENT DOCUMENTS 7,829,376 B1 * 11/2010 Adekore et al. .............. 438/104
7,906,362 B2    3/2011 Feuillet et al.
(Continued)

OTHER PUBLICATIONS

French Search Report Issued Jan. 5, 2011 in Patent Application No. 1054370 (with English translation of Categories of Cited Documents).

(Continued)

*Primary Examiner* — Scott B Geyer
(74) *Attorney, Agent, or Firm* — Oblon, Spivak, McClelland, Maier & Neustadt, L.L.P.

(57) ABSTRACT

A method for purifying an n-type ZnO and/or ZnMgO substrate to reduce or eliminate the residual extrinsic impurities including introducing a reactive species having strong chemical affinity for at least one of the residual extrinsic impurities, and/or being capable of creating crystalline defects, is introduced in at least one region of the substrate, the reactive species being P, and whereby at least one getter region capable of trapping the said residual extrinsic impurities and/or in which the residual extrinsic impurities are trapped is created in the substrate; then annealing the substrate to cause diffusion of the residual extrinsic impurities towards the getter region and/or to outside the getter region. A method for preparing a p-doped ZnO and/or ZnMgO substrate comprising purifying an n-type ZnO and/or ZnMgO substrate using the above purification method in which one or more reactive species are used not limited to phosphorus alone.

19 Claims, 7 Drawing Sheets

(56) References Cited

U.S. PATENT DOCUMENTS

| | | | |
|---|---|---|---|
| 2008/0041517 A1 | 2/2008 | Moriceau et al. | |
| 2009/0269879 A1* | 10/2009 | Adekore et al. | 438/104 |
| 2009/0311528 A1 | 12/2009 | Robin et al. | |
| 2010/0213406 A1* | 8/2010 | Buonassisi et al. | 252/181.6 |
| 2013/0122650 A1 | 5/2013 | Feuillet et al. | |

OTHER PUBLICATIONS

International Search Report Issued Sep. 13, 2011 in PCT/EP2011/059130.

Atsushi Tsukazaki et al., "Blue Light-Emitting Diode Based on ZnO", Japanese Journal of Applied Physics, vol. 44, No. 21, 2005, pp. L643-L645.

D.C. Look et al., "Effects of surface conduction on Hall-effect measurements in ZnO", Superlattices and Microstructures, vol. 38, 2005, pp. 406-412.

B.T. Adekore et al., "Nitrogen acceptors in bulk ZnO (0001) substrates and homoepitaxial ZnO films", Journal of Applied Physics, vol. 102, 2007, pp. 024908-1-024908-12.

Q.L. Gu et al., "Deep level defects in a nitrogen-implanted ZnO homogeneous p-n. junction", Applied Physics Letters, vol. 92, 2008, pp. 222109-1-222109-3.

V.A. Perevoschikov et al., "Gettering Defects in Semiconductors", Springer Berlin Heidelberg, http://books.google.fr/books?id=bCALW7YRKmUC&pg=PA127&lpg=PA127&dg=gettering+defects+in+semiconductors&source=bl&ots=XBDxZIGTL5&sig=WT7MtGsktHNdTYuXWDx5vtq3t84&hl=fr&sa=X&ei=RLteUbC0CcG1PM__mgLAC&ved=0CDkQ6AEwAQ#v=onepage&q=gettering%20defects%20in%20semiconductors&f=false, 2005, pp. 127.

Thomas Moe Børseth et al., "Vacancy clustering and acceptor activation in nitrogen-implanted ZnO", Physical Review B, XP002615654, vol. 77, 2008, pp. 045204-1-045204-6.

T.M. Børseth et al., "Annealing study of Sb* and Al* ion-implanted ZnO", Superlattices and Microstructures, XP005153776, vol. 38, 2005, pp. 464-471.

W.A. Doolittle et al., "Recent Advances in III-Nitride Devices Grown on Lithium Gallate", phys. stat. sol. (a), vol. 188, No. 2, 2001, pp. 491-495.

J. T. Walton et al., "Lithium Drifted Silicon Detector Fabrication on Gettered Floating-Zone Silicon", IEEE Transactions on Nuclear Science, vol. 41, No. 4, Aug. 1994, pp. 1031-1036.

J. Sangster et al., "The Li-P (Lithium-Phosphorus) System", Journal of Phase Equilibria, vol. 16, No. 1, 1995, pp. 92-93.

* cited by examiner

Step 1: Embedding getter species by ion implantation

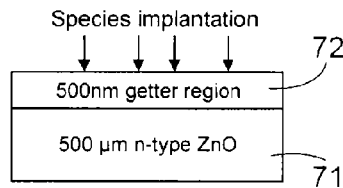

FIG.7A

Step 2: diffusion annealing of lithium in the getter region

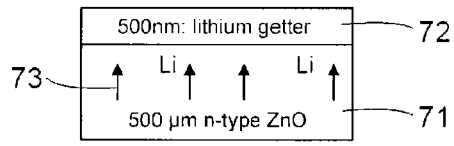

FIG.7B

Step 3: growth of epitaxied or deposited layers: no diffusion of lithium in these layers Step 3A : directly on the getter region

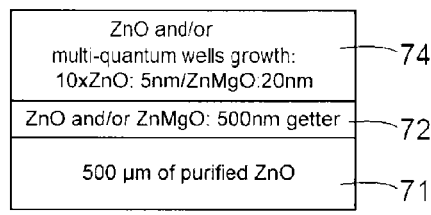

FIG.7C

Step 3B : growth after removal of the getter region

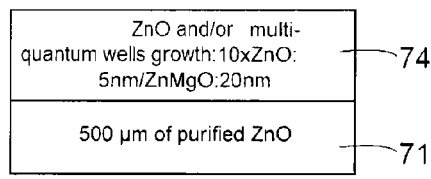

FIG.7D

Step 4 : p-doping in-situ or ex-situ of the layers epitaxied or deposited at steps 3A or 3B

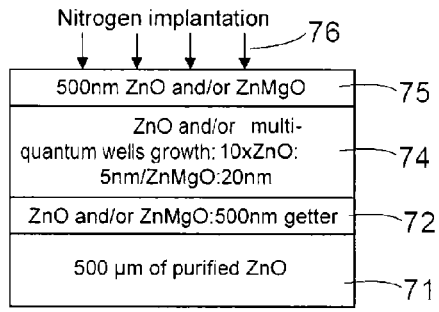

FIG.7E

Step 5 : annealing to heal defects and activate dopants

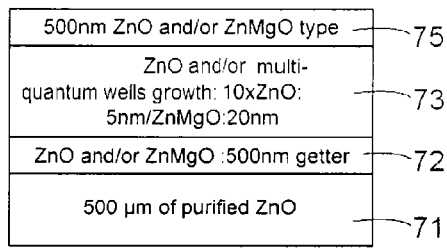

FIG.7F

Step 1: ion implantation

Step 2 : diffusion annealing of Li towards getter region

Step 3 : nitrogen ion implantation

Step 4 : post-implantation annealing to heal defects and activate dopants

Step 1 : nitrogen ion implantation

Step 2: annealing to heal defects and activate dopants

Step 3: implantation getter species

Step 4: post-implantation anneal to trap lithium in the getter region

METHOD FOR REMOVING RESIDUAL EXTRINSIC IMPURITIES IN AN N TYPE ZNO OR ZNMGO SUBSTRATE, FOR P-TYPE DOPING OF THIS SUBSTRATE

CROSS-REFERENCE TO RELATED APPLICATIONS

This application is a National Stage of PCT/EP11/059130 filed Jun. 1, 2011. This application is based upon and claims the benefit of priority to French Application No. 10 54370 filed Jun. 3, 2010.

TECHNICAL FIELD

The invention concerns a method for at least partly removing residual extrinsic impurities in an n-type ZnO or ZnMgO substrate, and for carrying out p-type doping of this substrate.

More specifically, the invention concerns a method for purifying a n-type ZnO and/or ZnMgO substrate to reduce or eliminate, remove, extrinsic impurities from the substrate with a view to performing p-type doping of at least part of the substrate, this purification method using phosphorus as reactive species.

The invention also concerns a method for preparing a ZnO and/or ZnMgO substrate that is at least partly p-doped, comprising at least one purification step of an n-type ZnO and/or ZnMgO substrate using the said purification method, but in which one or more reactive species are used which are not limited to phosphorus alone.

The technical field of the invention can be generally defined as the preparation, fabrication of p-doped ZnO or ZnMgO substrates, from substrates that are naturally of n-type.

It is specified that the terms <<ZnO or ZnMgO substrate>> do not imply any limitation in particular with regard to the type and form of this substrate.

Therefore, the substrate which could possibly be qualified as a <<structure>> may be a <<bulk>>, "solid", ZnO or ZnMgO substrate with a thin or thick epitaxied layer of ZnO or ZnMgO, or else a <<bulk>>, "solid", ZnO or ZnMgO substrate on which a thin or thick layer of ZnO or ZnMgO has been grown by epitaxy.

In other words, the term substrate designates any material of ZnO or ZnMgO type, whether derived from a bulk, solid, material or consisting of ZnO or ZnMgO epitaxied layer(s), with or without a quantum well structure and deposited on any type of material other than ZnO or ZnMgO.

The substrate may, for example, comprise alternating layers of ZnO and ZnMgO with or without a quantum well structure.

STATE OF THE PRIOR ART

The development of ZnO material has been prompted by the fact that it has electrical and optical properties of interest for applications in the field of electro-optics.

The two advantages of ZnO are firstly its wide <<gap>> with emission in the ultraviolet, and secondly it high excitonic band energy which is 60 meV.

ZnO is a semi-conductor of intrinsic n-type and its concentration of impurities of donor type varies in relation to the synthesis method used: hydrothermal synthesis, Metal Organic Vapour Phase Epitaxy (MOVPE), molecular beam epitaxy (MBE).

To produce an electronic and/or optical component, it must be possible to obtain a junction i.e. a p-n homo-junction or hetero-junction, namely to grow p-type wide gap material ZnO and/or ZnMgO on n-type ZnO and/or ZnMgO.

By homo-junction is meant that the two constituent materials of the junction are identical, for example the two materials are both ZnO or both ZnMgO; and by hetero-junction is meant that the two constituent materials of the junction are different.

A material that is intrinsically n-type must therefore be converted to obtain a p-type material.

This doping step is crucial to prepare opto-electronic components, but it remains very difficult to obtain quality p-n junctions.

The p-doping process includes a step to compensate the activated residual donors of the material, by adding acceptors.

In addition, for true p-doping and p-type conduction it is necessary to have a concentration of activated acceptors that is much higher than the concentration of activated residual donors.

P-type doping can be obtained by in-situ doping.

In this respect, mention can be made inter alia of the work by A. Tsukazaki et al. [1] who produced a p-i-n ZnO structure, i.e. a p-type ZnO structure on an ZnO insulator, itself on n-type ZnO, on a SCAM substrate ($ScAlMgO_4$) coated with a thin ZnO layer by <<MBE>> growth. The electroluminescent signal resulting from this structure is very weak however and spread over a wide spectral range from violet to green.

Other routes for obtaining p-type doping of ZnO and/or ZnMgO are ex-situ doping via ion implantation or diffusion.

Application WO-A1-2007/117158 describes the obtaining of a p-type layer by ion implantation over a maximum depth of 100 nm in an n-type ZnO substrate.

This low energy implantation (from 1 keV to 100 keV) is followed by rapid thermal annealing using an electron beam in a vacuum.

With such implantation conditions, the potential acceptors are introduced over a narrow thickness namely over a thickness of less than 100 nm, close to the surface, which is a region of the material known to be highly reactive.

In particular, the formation of an n-type highly doped surface layer via adsorption of species present in the ambient atmosphere is often mentioned in the literature [2].

The estimated thickness of this n-type conductivity layer may reach up to ten nanometres and gradually increases over time, which causes instability of the p-doping obtained with this method making it therefore difficult to control.

In addition, since the thickness of the p region is narrow, the injected carriers may recombine on the surface of the material and not at the junction, thereby considerably reducing the efficacy of the component.

In the literature, other demonstrations of p-doping in ZnO by ion implantation are found, in particular for nitrogen implantations.

The article by B. T. Adekore et al. [3] can be cited in which donor/acceptor pairs can be seen in photoluminescence in the region of 3.067 eV over a well-defined range of annealing temperatures of between 850° C. and 1000° C., indicating the introduction, embedding of acceptors via nitrogen implantation. These authors also show the presence of a p-n homo-junction via current-vertical voltage measurements. Electroluminescence spectra are also presented but the signal is poor and results from the emission of the deep defect band. Contrary to the assertion made by the authors, there is no emission corresponding to the ZnO gap.

Other work conducted by Gu et al. [4] also evidences via current-voltage measurements the presence of a p-n homo-junction by nitrogen ion implantation, and a weak electroluminescence signal centred on the green range and not in the ultraviolet.

Even if the presence of acceptors, through the implantation in particular of nitrogen or via other doping techniques, has been optically and electrically shown in the literature, there is no electroluminescence (EL) in the UV associated with the junction. On the other hand weak emission in the green, preponderant in the EL spectrum, is observed. In addition, the diode breakdown voltages obtained are relatively low (5 to 6 V), which suggests that the junction is of very poor quality.

Also, the <<gettering>> technique consists of reducing or eliminating, removing, metal impurities in the active regions of electronic devices by trapping them in secondary regions. It is widely used in micro-electronics in the active region of silicon-based devices to reduce the concentration of metals such as iron for example. Metal impurities have effectively been identified as being the cause of the formation of deep levels which degrade electronic and/or opto-electronic properties of silicon components. The creation of a getter region outside the active region of devices allows electric characteristics of much better quality to be obtained: in particular, the leakage current of diodes has been seen to be greatly reduced and the breakdown voltages increased.

Gettering can be achieved using different methods amongst which mention may be made for example of boron or phosphorus diffusion on the back face of silicon, the damaging of the substrate by laser irradiation and finally ion implantation [5].

There are two chief mechanisms for gettering impurities via ion implantation:

1) Gettering via crystalline defects: in this case the getter region is a highly damaged region containing numerous crystalline defects.

This technique is illustrated in U.S. Pat. No. 4,975,126 for example in which the getter region is created by a succession of oxygen or nitrogen implantations in a silicon substrate to create an electrically insulating region full of defects. Trapping is obtained through the formation of weak bonds between the dangling bonds of the crystalline defects and the impurities of the material, making it possible to fix the highly mobile impurities therein.

2) Gettering through the formation of a chemical phase between the metal impurities of the material and a reactive element.

This technique is illustrated in U.S. Pat. No. 5,436,498 for example which describes the formation of a stable chemical phase between a so-called reactive element derived from column VI of the periodic classification of elements such as O, S, Se, Te . . . , and the metal impurity to be trapped. Trapping is obtained through the formation of strong bonds, which guarantees stability of the gettering region against the different heat cycles to which the material is subsequently subjected.

The synthesis of ZnO via hydrothermal route leads to the presence of a large concentration of lithium in commercial bulk, solid, substrates, which migrates from the inner bulk towards the surface very easily during annealing. Lithium diffuses even at ambient temperature in ZnO, preferably placing themselves in an interstitial site where it is a donor.

During growth methods on a ZnO substrate and in-situ doping (during growth) and ex-situ doping (after growth) the ZnO is heated. On this account, the migration of species to the surface and into the layers and their possible trapping is inevitable. This phenomenon is all the more marked the more the surface region is rich in defects and/or the more the dopant is able to have chemical reactivity with the diffusing impurities.

The diffusing and trapping of lithium in the region potentially of p-type have been scarcely described in the literature.

A study on the effect of post-implantation annealing temperature on ZnO implanted with nitrogen was conducted by T. M. Børseth et al. [6] These authors, by SIMS analysis, evidenced the gettering of lithium in the region implanted with nitrogen (which is a theoretically acceptor element in ZnO) at post-implantation annealing temperatures of 600° C. and 800° C. They were able to observe that the lithium accumulated in the implanted region is exo-diffused during annealing at 1000° C. Similar effects were observed for the surface implantation of aluminium (aluminium placing itself at a donor site in ZnO) by these same authors [7]. The SIMS profiles indicate that for post-implantation annealing at 900° C. and 1000° C., the lithium showed strong migration and was trapped in the implanted region.

In the light of documents [6] and [7], the inventors came to the conclusion that it is in no way mentioned or suggested in these documents that the absence of the exo-diffusion of lithium in the event of aluminium implantation can be accounted for by the gettering of lithium through the formation of a chemical phase with the aluminium. On the other hand, the exo-diffusion of lithium at 1000° C. when nitrogen is implanted evidences that the lithium is weakly linked to the other atoms of the crystal lattice.

The inventors have therefore evidenced that lithium can be identified as one of the main problems for control over ZnO and/or ZnMgO and more especially over the p-type doping thereof. The gettering of lithium by the acceptors implanted or introduced, embedded by in-situ doping or via defects e.g. implantation defects, will fully or partly prevent the activation of the acceptors and no doubt set up non-radiative recombination centres.

In the literature, some studies can be found describing the gettering of lithium by aluminium. For example mention can be made of lithium gettering in an LGO substrate (lithium gallate) for the growth of GaN [8]. The getter region is either a layer of AlGaN, or a AlGaN/GaN super lattice. Gettering is possible through the strong chemical affinity of lithium for aluminium. Mention can be made of the most relevant known phases involving lithium and aluminium: $Li_3Al_2$, $Li_2Al$, $Al_3Li$.

Similar studies [9], again for silicon substrates, were able to evidence the gettering of lithium by phosphorus. The getter region is a phosphorus glass deposited on the surface of the sample to be treated (source $POCl_3$).

Another impurity present in very large quantities in ZnO is hydrogen which is also an element which diffuses very easily. Hydrogen is known to passivate acceptors. In addition, just like lithium, hydrogen when in interstitial position is a donor in ZnO. On the other hand, very few studies are reported in the literature on this subject. This can be accounted for by the fact that hydrogen is a very light atom making it technically very difficult to analyse.

In the light of the foregoing, there is therefore a need for a method which provides for efficient, good quality p-doping of n-type ZnO and/or ZnMgO. By good quality p-doping is generally meant that the substrate thus doped has a high carrier density and mobility.

DESCRIPTION OF THE INVENTION

This goal and others are achieved according to the invention by the use, in a method for preparing a p-doped ZnO and/or ZnMgO substrate, of at least one step to purify an n-type ZnO and/or ZnMgO substrate to reduce or eliminate, remove, the residual extrinsic impurities of the substrate with a view to p-doping at least part of the substrate, this purification step being performed using a purification method wherein, in at least one region of the substrate, at least one reactive species is introduced, embedded having strong chemical affinity for at least one of the residual extrinsic impurities, and/or being capable of creating crystalline defects in the said region of the substrate, whereby at least one region called a getter region capable of trapping the said residual extrinsic impurities and/or in which the residual extrinsic impurities are trapped is created in the substrate; annealing of the substrate is then carried out to cause diffusion of the residual extrinsic impurities towards the getter region and/or to outside the getter region, preferably towards at least one surface of the substrate.

It is specified that by <<residual extrinsic impurities>> is generally meant all impurities other than the vacancies and interstitials of oxygen or zinc, which are already present in ZnO or ZnMgO (see below).

It is further specified that by <<reactive species having strong chemical reactivity for at least one of the residual extrinsic impurities>> is generally meant that this species is capable of creating strong bonds with at least one of the residual extrinsic impurities.

In general, the strong bonds are not affected by annealing and the residual extrinsic impurities thus trapped are not released during annealing.

The purification method also has recourse to the phenomenon of exo-diffusion.

For exo-diffusion, at least one reactive species is implanted in ZnO: this implantation will create crystalline defects; trapping is obtained through the formation of weak bonds between the dangling bonds of the crystalline defects and the residual extrinsic impurities. On annealing, the weak bond will break and the residual extrinsic impurities will be released and will migrate outside the getter region, in general towards at least one surface of the substrate.

It can in fact be said that during implantation, with a view to creating crystalline defects, the quantity of crystalline defects created is high and in excess relative to the residual extrinsic impurities.

On this account, all the defects are not occupied i.e. all the defects do not form weak bonds with the impurities. During annealing, there is therefore migration of the impurities to outside the getter region and also migration of the residual extrinsic impurities from the bulk of the substrate towards the getter region where they will be trapped by the annexed <<free>> crystalline defects.

By <<bulk>> (volume) of the substrate is generally meant the remainder of the substrate i.e. the part which is not the getter region, for example this may be the part of the substrate, such as one or more layers, underlying the getter region.

During annealing, in the getter region, there is also healing or deletion of the crystalline defects or holes.

Advantageously, the residual extrinsic impurities belong to the group consisting of metals and hydrogen.

Advantageously, the residual extrinsic impurities belong to the group consisting of lithium and hydrogen.

Advantageously, the reactive species is/are chosen from among the donor and/or acceptor reactive species of ZnO and/or ZnMgO, and the getter region is n-type or p-type conductive, or semi-insulating or insulating.

According to the invention, it is generally sought to produce with the purified substrate a diode having a p-n homo-junction or p-n hetero-junction (it is effectively possible for example to have a ZnO substrate and to grow ZnO or ZnMgO by epitaxy (hetero-junction) or it is possible for example to have a ZnO substrate and to grow ZnO (homo-junction) comprising a gettering region preferably giving an electroluminescence signal in the ultraviolet range. One example of a diode with p-n junction is illustrated in FIG. 4.

As a result, according to the invention, preference is given for this purpose to the use of an acceptor and/or donor reactive species in the ZnO and/or ZnMgO, namely in general elements from columns I, III or V of the periodic table of the elements.

This preference in the choice of reactive species is justified by the fact that it is generally desired, as is specified above, to obtain a junction, a p-n homo- or hetero-junction, and that the current applied to the device should preferably pass via the getter region. In this case (where the applied current preferably passes via the getter region), the conductivity of this getter region should be known, nonzero (i.e. the getter region should not be electrically insulating), and controlled via the n- or p-type doping thereof.

In the case where the current applied to the structure does not pass through the substrate, the getter region can be insulating, and any other getter species for ZnO and/or ZnMgO can be used.

In addition, this getter region must preferably have crystalline quality at least equivalent to the crystalline quality of the material before the formation of the getter region.

However the material of the getter region is not limited to materials having such crystalline quality.

Advantageously, the reactive species is/are chosen from among the elements of columns I, III or V of the periodic table of the elements.

Advantageously, the reactive species is/are chosen from among phosphorus and aluminium.

Advantageously, the reactive species is/are introduced, embedded in a least one region of the substrate by ion implantation, preferably by ion multi-implantation.

This ion implantation or multi-implantation may be hot implantation or multi-implantation or cold implantation or multi-implantation.

By <<hot ion implantation or multi-implantation>> is meant that this implantation or multi-implantation is generally conducted at a temperature of between ambient temperature and 1000° C., preferably at a temperature higher than ambient temperature and up to 1000° C., for example at a temperature of 500° C.

Hot implantation or multi-implantation allows the healing of part of the defects at the same time as they are created.

By using hot ion implantation or multi-implantation it is optionally possible to reduce the temperature and duration of a subsequent annealing step.

By <<cold ion implantation or multi-implantation>> is meant that this implantation is generally conducted at the temperature of liquid nitrogen e.g. at −200° C.

In all cases however it is necessary to perform annealing after implantation to heal the crystalline defects.

The annealing temperature is then generally from 300° C. to 1100° C., for example of the order of 900° C.

Therefore, if ion multi-implantation is conducted at ambient temperature, it is necessary afterwards to carry out annealing for example at a temperature of the order of 700° C., to heal the crystalline defects or dislocations.

Advantageously, the getter region is in the form of a layer.

Advantageously, the getter region is created on a surface of the substrate.

By <<on a surface of the substrate>> is generally meant that one of the surfaces of the getter region, for example its upper surface, constitutes a surface of the substrate.

It was evidenced by the inventors that the poor quality of the p-type doping and of the junctions obtained in the prior art, illustrated by the above-cited documents, was certainly due to the high concentration of mobile or fixed impurities (since the impurities may fully well be fixed within the lattice, giving rise to poor quality p-type doping), such as the lithium and hydrogen, present in ZnO and/or ZnMgO in very large quantities in the p-doped region of the material, these mobile or fixed impurities being capable of compensating for and/or passivating the introduced acceptors.

It can be said that the purification method implemented according to the invention allows the p-doping of n-type ZnO and/or ZnMgO to be obtained through the trapping of residual extrinsic impurities by the crystalline defects and through the formation of a chemical phase between the impurities and the introduced, embedded reactive species so as to allow the reduction and/or prevention of the diffusion of the residual extrinsic impurities.

This reduction and/or prevention of the diffusion of the residual extrinsic impurities are obtained using a technique allowing their exo-diffusion and/or their trapping.

The technique used according to the invention to thus purify the substrate is the so-called gettering technique, preferably via ion implantation.

In other words, the purification method implemented according to the invention allows to ensure trapping and/or to increase exo-diffusion of the impurities such as lithium and hydrogen in the substrates or layers, in particular epitaxied layers (thin and thick) of ZnO and/or ZnMgO, for the purpose of performing p-type doping of the ZnO and/or ZnMgO, and to obtain a p-n junction of high quality.

The invention is based on SIMS observations of samples implanted with phosphorus (which is a potentially acceptor species in ZnO) and annealed at high temperatures, whereby considerable trapping of lithium was observed in the implanted region as shown in FIG. 1.

It can clearly be seen in FIG. 1 that the lithium profile (curve B) overlays the profile of the implanted phosphorus (curve A), and that the concentrations are close, namely about $4 \times 10^{18}$ at/cm$^3$ of trapped Li for a phosphorus implantation profile of about $4 \times 10^{18}$ at/cm$^3$.

It can also be noted that the volume concentration of lithium has decreased, since it is about $1 \times 10^{17}$ at/cm$^3$ after implantation and annealing (curve B) compared with about $4 \times 10^{17}$ at/cm$^3$ for a raw, non-implanted, non-annealed substrate (curve C).

The substantial gettering of lithium by phosphorus can be accounted for by the strong chemical affinity of these two species. The known phases involving lithium and phosphorus are multiple, among these the most relevant being: Li$_3$P, LiP [10].

Phosphorus, like nitrogen, is an element from column V of the periodic table of the elements, and are potential acceptors in ZnO. If the lithium migrates and comes to be trapped in the implantation region forming a chemical phase with the doping species, or comes to bind with the dangling bonds of crystalline defects (it is to be noted that dislocations are included in the definition of crystalline defects), then it will be understood why the p-doping of ZnO and/or ZnMgO is at the present time so difficult, irrespective of the doping technique used i.e. whether by ion implantation by diffusion or during the growth of thin and/or thick n- or p-type doped layers via metal organic vapour phase epitaxy (MOVPE), molecular beam epitaxy (MBE) etc.

It was therefore possible to evidence the trapping of hydrogen in the nitrogen-implanted, annealed region as shown in FIG. 2. $2 \times 10^{19}$ at/cm$^3$ of hydrogen was observed for $6.2 \times 10^{19}$ at/cm$^3$ of implanted nitrogen.

The diffusion of lithium and hydrogen and/or the trapping by potentially acceptor dopants in the implanted region can explain firstly the difficulty for p-doping ZnO and/or ZnMgO and secondly the lack of control over the p-type when this is obtained, which is very often observed in the literature.

In other words, the invention is based on the properties of some impurities extrinsic to ZnO that are used to reduce the density of the residual extrinsic impurities.

It is to be noted that in the present application, a distinction is made between on the one hand the residual extrinsic impurities which are already present in the ZnO or ZnMgO, derived for example from the ZnO fabrication method and which are other than Zn or O vacancies or interstitials, and on the other hand the extrinsic impurities which are deliberately introduced into the ZnO and/or ZnMgO.

The decreased density of the residual extrinsic impurities in the ZnO and/or ZnMgO obtained according to the invention then allows efficient p-doping in these materials which, up until now, was limited by the presence of residual extrinsic impurities present in large quantity both in the substrates and in the epitaxied layers of ZnO and/or ZnMgO.

Commercial substrates and/or layers of ZnO contain a high quantity of lithium for example (about $4 \times 10^{17}$ at/cm$^3$) and hydrogen ($1 \times 10^{18}$ at/cm$^3$).

The purification method used according to the invention allows the purifying of n-type ZnO and/or ZnMgO for the p-type doping thereof.

This method is particularly based on the following mechanisms:
 the trapping of impurities, of lithium and/or hydrogen in particular, by crystalline defects (induced by ion implantation or pre-existing in the material);
 the increased exo-diffusion of the residual extrinsic impurities and in particular of lithium and/or hydrogen trapped by the crystalline defects (induced or pre-existing in the material). This is a phenomenon whereby the impurities weakly trapped by the crystalline defects are released via the surface. It therefore lies in the continuity of the above-described phenomenon. The concentration of the trapped elements is strongly decreased especially in the sub-surface region which often forms the active part of opto-electronic or electronic devices.
 the trapping (or gettering) of the residual extrinsic impurities of donor type in the ZnO and/or ZnMgO, such as lithium, through the possible formation of a chemical phase between the mobile impurity and the implanted element.

The ZnO and/or ZnMgO purified using the above-described purification method can be used to fabricate electronic, electro-optical, electronic or opto-electronic devices and can be used for example to manufacture light emitting diodes for lighting, substrates for the growth of epitaxial layers of ZnO and/or ZnMgO or of any other material e.g. GaN, or as seed for the synthesis of bulk, solid, ZnO and/or ZnMgO material. The purified material can also be used for the growth of nanowires of ZnO and/or ZnMgO or of any other material e.g. GaN.

The purification method described above for cases in which a reactive species which is specifically phosphorus is introduced into at least one region of the substrate has never been described in the prior art as represented in particular by the above-cited documents.

The invention therefore concerns a method for purifying a substrate of n-type ZnO and/or ZnMgO to reduce or eliminate the residual extrinsic impurities of the substrate with a view to p-doping at least part of the substrate whereby, in at least one region of the substrate, a reactive species is introduced, having strong chemical affinity for at least one of the residual extrinsic impurities and/or is capable of creating crystalline defects, the said reactive species being P, and whereby at least one region called getter region is created in the substrate capable of trapping the said residual extrinsic impurities and/or in which the residual extrinsic impurities are trapped; the substrate is then annealed to cause diffusion of the residual extrinsic impurities towards the getter region and/or to outside the getter region, preferably towards at least one surface of the substrate.

Advantageous embodiments of this purification method according to the invention were already described in the foregoing and are also described in appended claims 2 to 7.

The invention further concerns a method for preparing a p-doped substrate of ZnO and/or ZnMgO comprising at least one purification step of an n-type ZnO and/or ZnMgO substrate using the above-described purification method in its most general case i.e. when at least one reactive species is implanted in at least one region of the substrate, this reactive species not being limited to phosphorus alone.

The invention therefore also concerns a method for preparing a p-doped substrate made of ZnO and/or ZnMgO comprising at least one purification step of an n-type substrate made of ZnO and/or ZnMgO to reduce or eliminate the residual extrinsic impurities of the substrate with a view to p-type doping of at least one part of the substrate, the said purification step being conducted using a purification method in which at least one reactive species having strong chemical affinity for at least one of the residual extrinsic impurities and/or being capable of creating crystalline defects, is introduced in at least one region of the substrate, and whereby at least one region called a getter region capable of trapping the said residual extrinsic impurities and/or in which the residual extrinsic impurities are trapped is created in the substrate; annealing of the substrate is then carried out to cause diffusion of the residual extrinsic impurities towards the getter region and/or to outside the getter region, preferably towards at least one surface of the substrate.

Advantageous embodiments of the purification step for this preparation method were already described above and are also described in appended claims 9 to 15.

This preparation method has never been described in the prior art and has a whole series of advantages inherent in the purified substrate prepared using the purification method according to the invention, and which are mentioned in the present description.

In particular, the preparation method according to the invention allows the controlled, reproducible p-type doping of ZnO and/or ZnMgO. In addition, the preparation method according to the invention ensures and controls an efficient doping i.e. a doping allowing in particular an electroluminescence signal to be obtained in the UV range.

The method according to the invention for preparing a substrate made of p-type doped ZnO and/or ZnMgO, comprises according to a first embodiment the following successive steps:

a) in a planar n-type ZnO and/or ZnMgO substrate, starting from the upper surface of the substrate, a getter region is created, for example by ion implantation;

b) the substrate is annealed to cause diffusion of the residual extrinsic impurities contained in the substrate underneath the getter layer, towards the getter layer;

c) the getter layer is optionally removed;

d) on the getter layer or on the substrate from which the getter region has been removed, n-type or p-type ZnO and/or ZnMgO is deposited e.g. by epitaxy;

e) optionally, if at step d) n-type ZnO and/or ZnMgO was deposited, the deposited n-type ZnO and/or ZnMgO is p-doped e.g. by ion implantation or by diffusion;

f) optionally annealing is performed to heal implantation defects and to activate the p-type dopants of the ZnO and/or ZnMgO.

The method for preparing a p-doped ZnO and/or ZnMgO substrate according to the invention, in this first embodiment, therefore generally consists of purifying a ZnO and/or ZnMgO material using the purification method defined above (with no limitation as to the reactive species), of forming epitaxied or deposited layers of very high purity on this purified material, and of p-doping these epitaxied or deposited layers.

More specifically, the purification using the method according to the invention allows the trapping of residual extrinsic impurities such as lithium for example which are present in large quantity in the ZnO and/or ZnMgO material, to reduce and even eliminate their diffusion into the layers epitaxied or deposited on a ZnO and/or ZnMgO material. It also allows an <<epi-ready>> surface to be maintained i.e. a surface ready for epitaxial growth.

For this purpose, a species e.g. phosphorus is introduced close to the surface or more into the bulk, capable of creating numerous crystalline defects and/or having strong chemical affinity for the residual extrinsic impurities such as lithium, via ex-situ route (by ion implantation for example) or via in-situ route (during growth of the layers) in the ZnO and/or ZnMgO material.

If gettering is obtained by ion implantation, the material must be annealed at optimal temperature to allow exo-diffusion and/or trapping of the residual extrinsic impurities of the material, such as lithium and hydrogen, and to create an optional chemical phase between the residual extrinsic impurities e.g. lithium and/or hydrogen and the implanted species. This getter region may optionally be removed before growth by polishing, etching etc.

The getter region that is generally conductive, preferably of n-type, is intended:

to purify the bulk ZnO and/or ZnMgO of its residual extrinsic impurities, such as lithium, by gettering. The advantage of implantation and multi-implantation (several energies and associated doses) is that of introducing a high concentration of reactive species and defects so as to:

create a region in which the concentrations of residual extrinsic impurities such as lithium and hydrogen trapped in and/or removed from the substrate are strongly reduced: phenomenon of trapping via defects and/or exo-diffusion, via the optional formation of a chemical phase between the residual extrinsic impurities and a donor and/or acceptor reactive species in the ZnO and/or ZnMgO introduced into the ZnO and/or ZnMgO by ion implantation or during the growth of thin or thick layers (i.e. in-situ).

to reach the two first above-mentioned objectives whilst maintaining nonzero n-type or p-type conductivity in the getter region, to obtain a substrate made of ZnO and/or ZnMgO whose residual extrinsic impurities are trapped, which will prevent the diffusion thereof during the growth of thin or thick layers on this substrate and/or when producing heterostructures and/or when producing nanowires.

To summarize, the purification method used according to the invention allows the reduction and even the elimination of the migration of residual extrinsic impurities such as the migration of lithium and hydrogen for example into the layers subsequently formed on the ZnO and/or ZnMgO material thus treated, through the formation of a relatively thin barrier layer. The residual extrinsic impurities e.g. lithium will be absent from these layers which can consequently be efficiently p-doped or n-doped with high purity.

FIG. 3 illustrates the principle of trapping the residual extrinsic impurities e.g. lithium and hydrogen of a ZnO and/or ZnMgO material in a substrate prepared using the preparation method of the invention according to the first embodiment thereof.

Region 1 (31) consists of n-type ZnO and/or ZnMgO generally having a thickness of 100 to 1000 µm, for example a thickness of 500 µm.

Region 2 (32) consists of a getter region made of ZnO and/or ZnMgO to trap impurities such as lithium and hydrogen, and generally has a thickness of 100 to 500 nm, for example of 500 nm.

Region 3 (33) consists of n-type ZnO and/or ZnMgO of high purity, and has no impurities on account of the presence of the underlying getter layer of region 2.

The n-type ZnO and/or ZnMgO of this region may be in the form of a layer generally having a thickness of 10 to 1000 nm, for example 500 nm, and/or ZnO/ZnMgO multi-quantum wells, for example 10×ZnO: 5 nm/ZnMgO:20 nm.

Region 4 (34) consists of p-type ZnO and/or ZnMgO generally having a thickness of 100 to 1000 nm, for example of 500 nm.

FIG. 4A illustrates a diode with p-n homo-junction comprising the substrate of FIG. 3 provided with front (35) and back (36) contacts. The diode of FIG. 4A is in a so-called <<vertical configuration>>.

It is to be noted that similar diodes can be fabricated with the substrates of FIGS. 5 and 6 by providing them with suitable contacts.

FIG. 4B illustrates a diode with p-n homo-junction comprising a substrate according to FIG. 3 provided with contacts (37). The diode in FIG. 4B is in a so-called <<horizontal configuration>> and on this account the regions 3 and 4 as well as the position of the contacts have been modified compared with the vertical configuration of FIG. 4A.

In this configuration or horizontal technology, the current chiefly circulates at the regions 3 (33) and 4 (34).

In a second embodiment of the method for preparing a p-doped ZnO and/or ZnMgO substrate according to the invention, the ZnO and/or ZnMgO material is purified of its impurities such as lithium and hydrogen, and p-type doping of the material is also carried out.

This second embodiment of the method of the invention for preparing a p-type ZnO and/or ZnMgO substrate may comprise two variants which at the same time allow the purifying of the material of its residual extrinsic impurities such as lithium and hydrogen, and the p-type doping thereof.

The first variant of this second embodiment, called embodiment 2A, comprises the following successive steps:

a) in a planar n-type ZnO and/or ZnMgO substrate, and starting from the upper surface of the substrate, a deep getter layer is created having a thickness of 500 nm or more;

b) the substrate is annealed on the one hand to cause diffusion of the residual extrinsic impurities, contained in the substrate underneath the getter layer, towards the getter layer (and to trap the residual extrinsic impurities in the getter layer), and on the other hand to reduce the concentration of residual extrinsic impurities in the upper part of the getter layer, close to its upper surface;

c) at least one p-type dopant is introduced in the upper part of the getter layer;

d) optional annealing is conducted to heal implantation defects and to activate the p-type dopants of the substrate.

The second variant of this second embodiment, called embodiment 2B, comprises the following successive steps:

a) in a planar substrate of n-type ZnO and/or ZnMgO, starting from the upper surface of the substrate, a deep p-type layer is created having a thickness of 500 nm or more;

b) optional annealing is performed to heal implantation defects and to activate the p-type dopants of the substrate;

c) in the p-type layer, from the upper surface of the p-type layer, a getter layer is created;

d) the substrate is annealed to cause diffusion of the residual extrinsic impurities, contained in the substrate and in the p-type layer, towards the getter layer and to trap the residual extrinsic impurities in the getter layer;

e) optionally, the getter layer is removed.

Embodiment 2A consists of creating a deep getter layer and of p-doping thereupon.

Embodiment 2B consists of the reverse i.e. performing deep p-type doping and forming a getter layer at the surface which is later removed by polishing, etching or other methods.

Embodiment 2A therefore has recourse to a <<deep gettering>> technique whilst embodiment 2B has recourse to a <<surface gettering>> technique.

More specifically, what is meant by <<deep gettering>> in embodiment 2A is the creation of a region at the surface but sufficiently at depth to allow the trapping (cf. FIG. 5), within this region, of residual extrinsic impurities, e.g. lithium, to purify the bulk of the ZnO and/or ZnMgO but more especially to strongly reduce the concentration of residual extrinsic impurities e.g. of lithium and hydrogen close to the surface (in the near surface).

With so-called <<vertical>> technology (illustrated in FIG. 4A), good conductivity is maintained in the getter region, i.e. conductivity equal to or higher than that of the n-type ZnO and/or ZnMgO before purification.

With so-called <<horizontal>> technology (illustrated in FIG. 4B), the getter layer may be semi-insulating or insulating, the conduction of the getter layer effectively being of little importance.

The near surface region for example having a thickness of 500 nm in which the concentration of impurities e.g. lithium will be strongly reduced, is subsequently p-doped.

With this approach, the deeper the gettering region, the greater the concentration of getter elements and the quantity of defects induced by introducing these elements and the greater the quantity of impurities, e.g. lithium, that is trapped.

FIG. 5 illustrates the principle of <<deep gettering>> to trap the residual extrinsic impurities such as lithium and hydrogen of a ZnO and/or ZnMgO material, and to allow p-type doping. Region 1 (51) consists of n-type ZnO and/or ZnMgO.

The n-type ZnO and/or ZnMgO of this region may be in the form of a layer generally having a thickness of 100 nm to 1 µm, for example 500 nm, and/or of ZnO/ZnMgO multi-quantum wells, for example multi-quantum wells of 10×ZnO:5 nm/ZnMgO:20 nm.

Region 2 (52) is a region of ZnO and/or ZnMgO, which is a getter region to trap residual extrinsic impurities such as lithium and hydrogen, of a thickness generally of 100 to 500 nm, for example of 500 nm, whose n-type conductivity is generally necessary for a vertical p-n diode such as the one described in FIG. 4A.

Region 3 (53) is a p-type doped region of ZnO and/or ZnMgO generally of a thickness of 100 to 1000 nm, for example of 500 nm.

The formation of this structure generally requires the three following inseparable steps:

a) The formation of a deep getter layer, preferably conductive, on a ZnO and/or ZnMgO material, for example by ion implantation of donor or acceptor impurities for ZnO and/or ZnMgO such as aluminium or phosphorus respectively. The advantage of implantation and multi-implantation (several energies and associated doses) is that of introducing a high concentration of reactive species and defects to trap and/or exo-diffuse a high concentration of impurities such as lithium and optionally to form a chemical phase.

b) Optional removal of the near surface to remove impurities not completely exo-diffused during annealing, c) Formation of a p-type layer for example over a thickness of about 500 nm, for example by ion implantation of an acceptor element in ZnO and/or ZnMgO, it is preferably an element from column V or I of the periodic table of the elements.

The first step consists of forming a deep getter layer that is n-type conductive and is intended to:

create a region in which the concentrations of impurities such as lithium and hydrogen are strongly reduced, namely generally to concentrations of less than $10^{13}$ atoms/cm$^3$ due to a phenomenon of trapping by the defects and exo-diffusion, purify the bulk of the ZnO and/or ZnMgO of its impurities such as lithium by gettering through the formation of a chemical phase between the impurities such as lithium and a donor and/or acceptor reactive species in ZnO and/or ZnMgO introduced in the ZnO and/or ZnMgO via ion implantation or during the growth of thin or thick layers, reach the two first above-cited objectives whilst preferably maintaining nonzero conductivity in the getter region, ideally at least equal to the conductivity of the ZnO and/or ZnMgO material before purification.

The sole objective of the second step is p-type doping of the ZnO and/or ZnMgO over a thickness of about 500 nm for example.

In the present invention, irrespective of the embodiment, the reactive species is preferably chosen from among the extrinsic impurities of ZnO and/or ZnMgO whether or not residual, preferably among the donor extrinsic impurities of ZnO and/or ZnMgO (column III of the periodic table of the elements) so that the deep layer remains n-type conductive with a conductivity ideally at least equal to the conductivity of the ZnO and/or ZnMgO material before purification and to avoid the formation of an electrically insulating layer.

However, it is not excluded to implant an acceptor species (column I and V of the periodic table of the elements) and to maintain a n-type conductivity ideally at least equal to the conductivity of the ZnO and/or ZnMgO material before purification.

In embodiment 2B <<surface gettering>> or surface trapping is performed.

Surface trapping has the same objectives as deep trapping but it is conducted differently.

The formation of this structure requires the three following inseparable steps:

a) Formation of a p-type deep layer, for example by ion implantation of an acceptor element in ZnO and/or ZnMgO. This acceptor element is preferably an element from column V or column I of the periodic classification of elements.

b) Formation of a surface layer, for example by ion implantation of donor or acceptor impurities for ZnO and/or ZnMgO such as aluminium and phosphorus respectively for example.

The advantage of implantation and multi-implantation (several energies and associated doses) is to introduce a high concentration of reactive species and defects to trap and/or exo-diffuse a high concentration of impurities e.g. lithium, and optionally to form a chemical phase.

c) Removal of the surface getter region.

The first step of this embodiment 2B consists of forming a deep p-type conductive ZnO/ZnMgO layer, over a thickness d generally of 500 nm or more.

The second step consists of creating a getter region or trapping region at the top surface of the said deep layer.

By <<top surface>> is meant that the getter region is created over a depth d that is smaller than the thickness of the deep layer, preferably over a depth d less than one half of the thickness of the deep p-type conductive ZnO/ZnMgO layer to:

create a region in which the concentrations of residual extrinsic impurities, e.g. of lithium and hydrogen, are strongly reduced, namely generally to less than $10^{13}$ atoms/cm$^3$ by a phenomenon of exo-diffusion of the impurities previously trapped by the defects, purify the ZnO and/or ZnMgO of its residual extrinsic impurities, e.g. of lithium, in the bulk thereof but more especially in the p-doped region, through the possible formation of a chemical phase between the impurities, e.g. lithium, and a donor and/acceptor reactive species introduced by ion implantation or during the growth of thin or thick layers.

The third step allows the removal of the getter region which contains the trapped residual extrinsic impurities.

FIG. 6 illustrates the principle of surface gettering to trap the impurities e.g. lithium and hydrogen of a ZnO and/or ZnMgO material and to allow p-type doping.

Region 1 (61) consists of n-type ZnO and/or ZnMgO.

The n-type ZnO and/or ZnMgO of this region may be in the form of a layer, generally of a thickness from 1 to 500 μm, for example of 1 μm, and/or of ZnO/ZnMgO multi-quantum wells of thickness generally of 10 to 100 nm e.g. 25 nm, or else the ZnO and/or ZnMgO of this region may be in a form similar to that of layers (33) or (51) of FIGS. 3, 4A, 4B and 5.

Region 2 (62) is a p-doped region of ZnO and/or ZnMgO having a thickness generally of 100 to 1000 nm, for example of 500 nm.

Region 3 (63) is a getter region of ZnO and/or ZnMgO to trap residual extrinsic impurities such as lithium, whose conductivity is of little importance. This region generally has a thickness of 100 to 500 nm, for example of 500 nm.

The invention will be better understood on reading the following detailed description of preferred embodiments of the method of the invention, given as non-limiting illustrations.

BRIEF DESCRIPTION OF THE DRAWINGS

The detailed description is given with reference to the appended drawings in which.

The concentration (in at/cm$^3$) is given along the Y-axis, and the analysis depth d (using SIMS) of the sample in μm is given along the X-axis.

Figure 1:
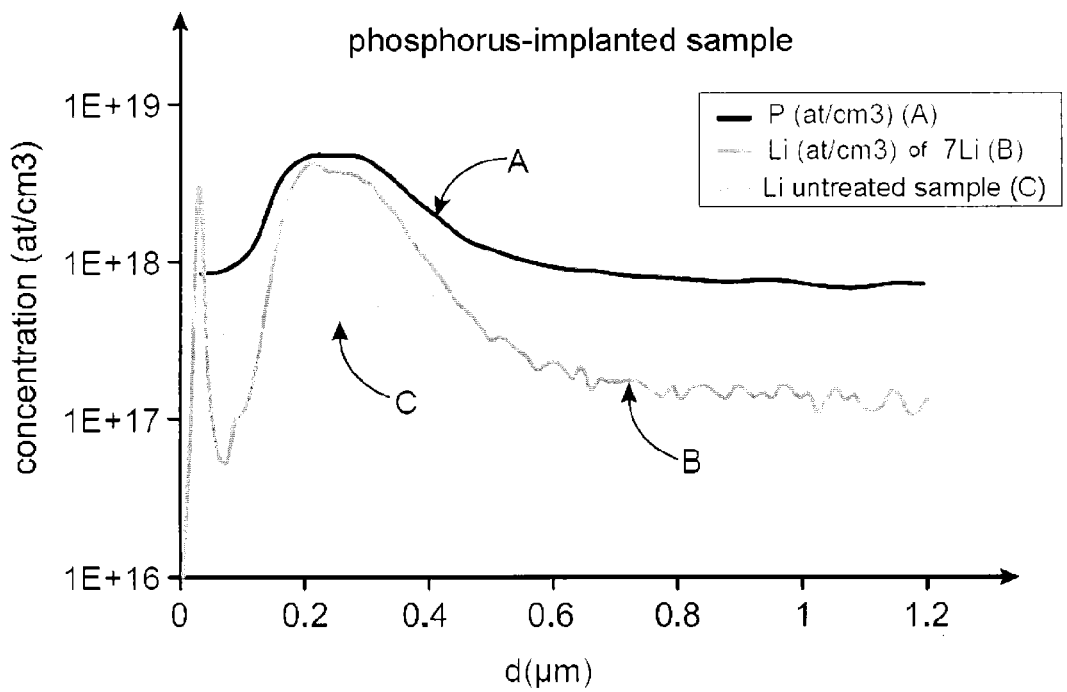
FIG. 1 is a graph giving the SIMS profile of a ZnO substrate implanted with phosphorus, at Rp=0.3 μm. Curve A gives the concentration of implanted phosphorus. Curve B gives the concentration of lithium trapped in the phosphorus-implanted sample after post-implantation annealing. Curve C gives the concentration of lithium in a raw, non-treated ZnO substrate, sample i.e. not implanted and not annealed.
Figure 2:
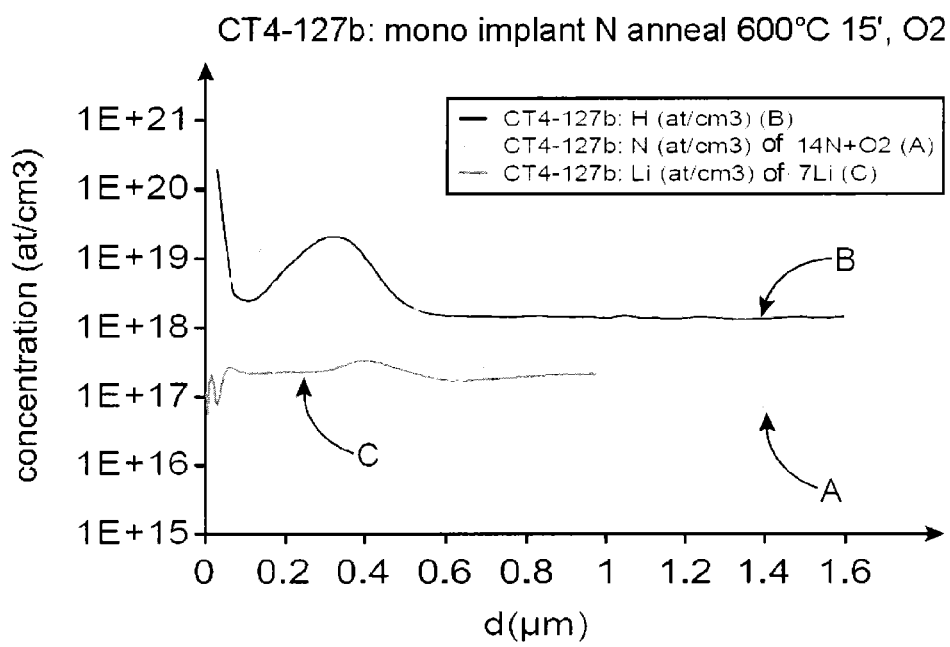

FIG. 2 is a graph which gives a SIMS profile of a nitrogen-implanted ZnO sample, annealed at 600° C. for 15 minutes in oxygen.

Curve A gives the concentration of implanted nitrogen. Curve B gives the concentration of hydrogen in the nitrogen-implanted region after post-implantation annealing. Curve C gives the lithium concentration in a raw, a non-treated ZnO sample, substrate i.e. not implanted and not annealed.

The concentration (in at/cm$^3$) is given along the Y-axis, and the analysis depth d of the sample in μm is given along the X-axis.

Figure 3:
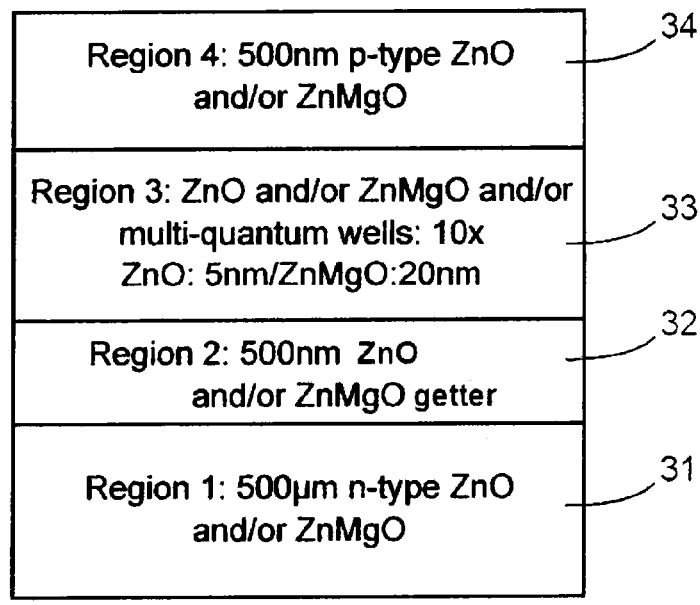

FIG. 3 is a cross-sectional side view of a p-doped substrate obtained using the method of the invention for preparing a p-type ZnO and/or ZnMgO substrate according to the first embodiment thereof.

Figure 4A:
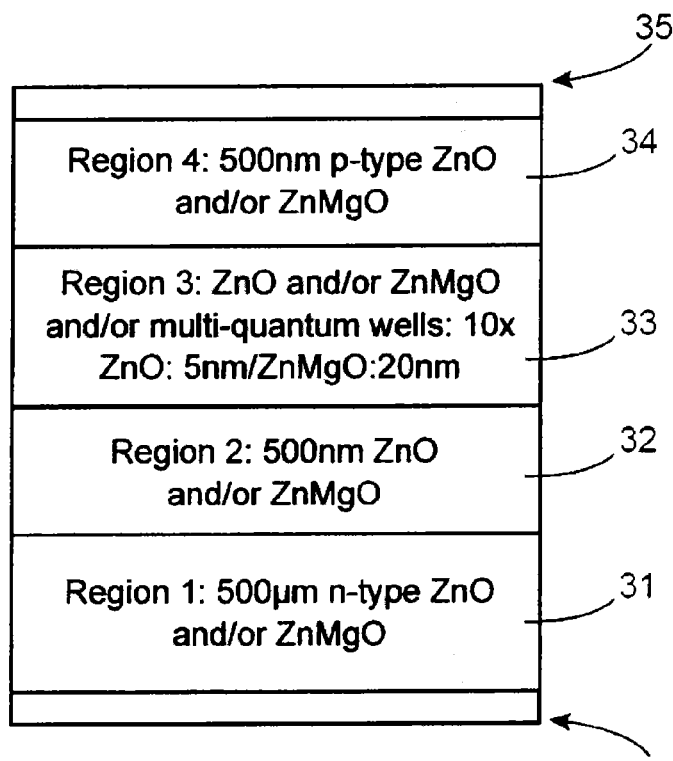

La FIG. 4A is a cross-sectional side view of a p-n junction (homo-junction or hetero-junction) comprising a getter region, this structure having been prepared using the method of the invention for preparing a p-type ZnO and/or ZnMgO substrate according to the first embodiment thereof. FIG. 4A illustrates a so-called <<vertical>> technology.

Figure 4B:
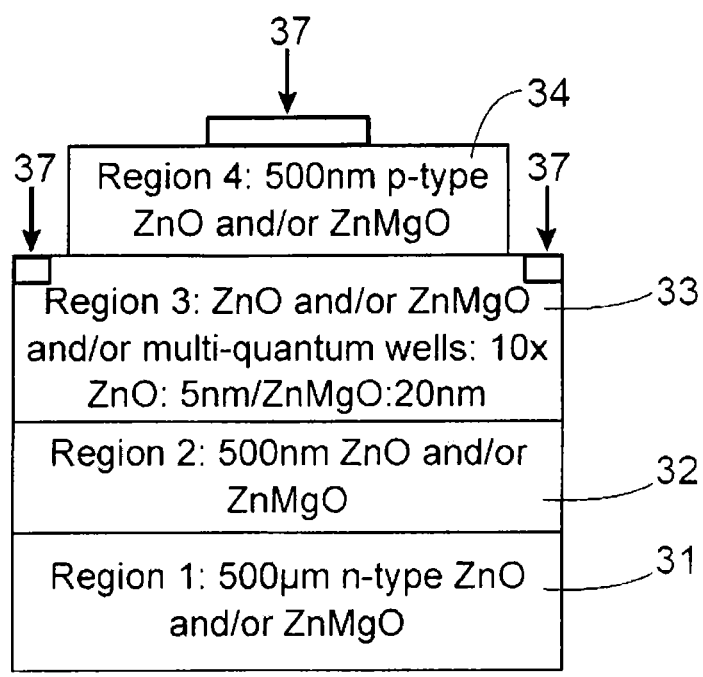

FIG. 4B is a cross-sectional vertical view of a p-n junction (homo-junction or hetero-junction) comprising a getter region, this structure having been prepared using the method of the invention for preparing a p-type ZnO and/or ZnMgO substrate according to the first embodiment thereof. FIG. 4B illustrates a so-called <<horizontal>> technology.

Figure 5:
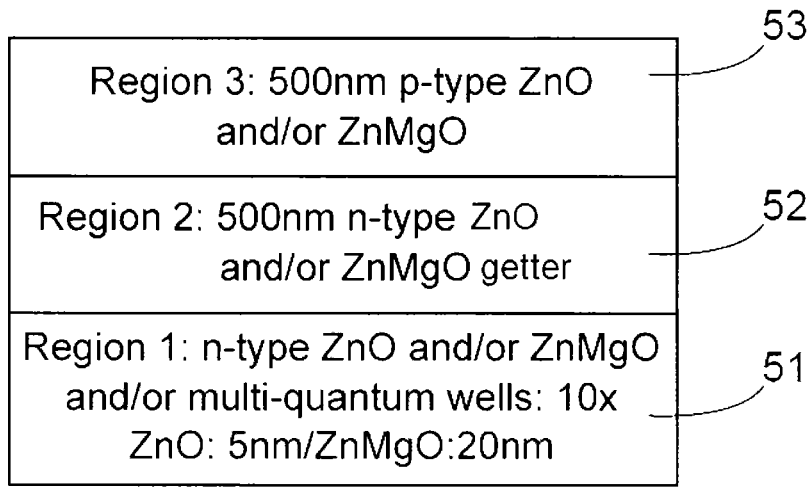

FIG. 5 is a cross-sectional side view of a p-doped substrate obtained using the method of the invention for preparing a p-type ZnO and/or ZnMgO substrate according to embodiment 2A thereof.

Figure 6:
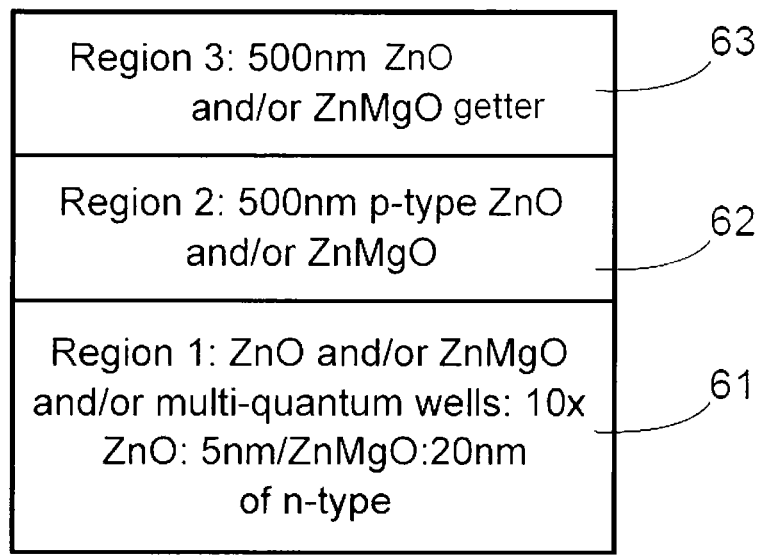
Figure 8A:
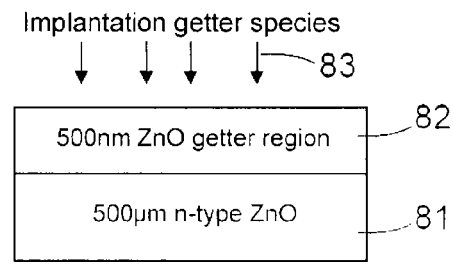
Figure 8B:
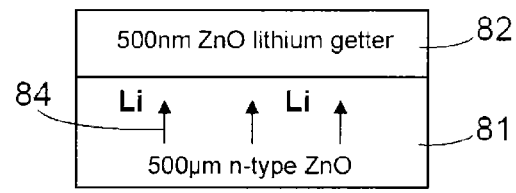
Figure 8C:
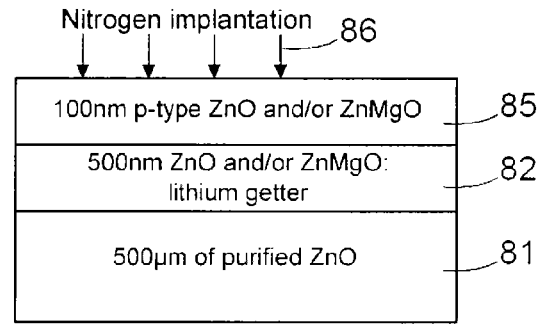
Figure 8D:
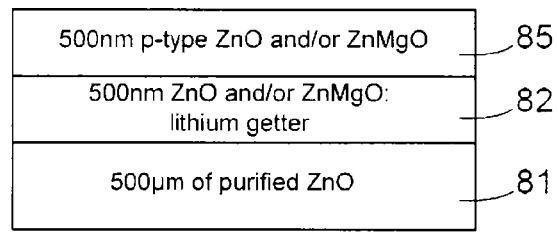
Figure 9A:
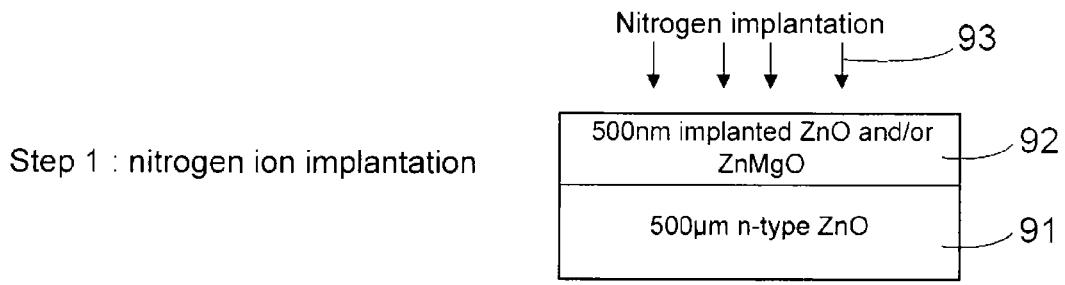
Figure 9B:
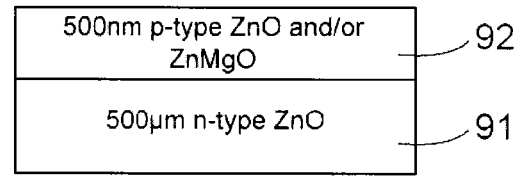
Figure 9C:
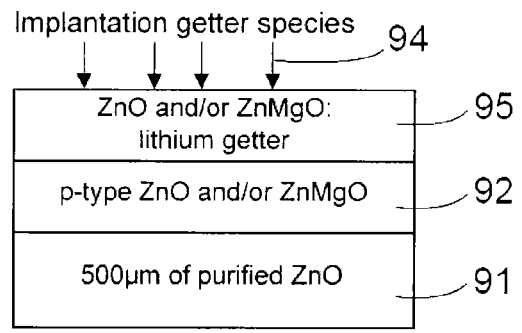
Figure 9D:
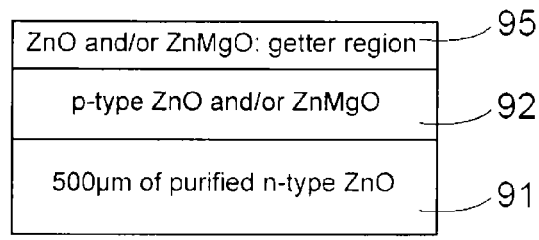

FIG. 6 is a cross-sectional side view of a p-doped substrate obtained using the method of the invention for preparing a p-type ZnO and/or ZnMgO substrate according to embodiment 2B thereof.

FIGS. 7A to 7F illustrate the successive steps of the method according to the invention for preparing a p-type ZnO and/or ZnMgO substrate according to the first embodiment thereof.

FIGS. 8A to 8D illustrate the successive steps of the method of the invention for preparing a p-type ZnO and/or ZnMgO substrate according to embodiment 2A thereof.

FIGS. 9A to 9D illustrate the successive steps of the method of the invention for preparing a p-type ZnO and/or ZnMgO substrate according to embodiment 2B thereof.

It is to be noted that in all the Figures, the thicknesses and sizes, and other mentioned values, are only given as examples by way of indication; and in no way do they form any limitation thereof.

DETAILED DESCRIPTION OF PARTICULAR EMBODIMENTS

According to a first embodiment of the preparation method of the invention, an n-type ZnO or ZnMgO substrate is purified by gettering. The epitaxy or depositing of layers of very high purity is then performed on this purified substrate, and p-doping of these layers.

FIG. 7 describes the different possible steps for this first embodiment of the preparation method:

Step 1 (FIG. 7A):

Introducing, embedding, for example by ion implantation in an n-type ZnO or ZnMgO substrate, a species having strong chemical affinity for residual extrinsic impurities such as lithium for example, to form a region called a getter region.

The n-type ZnO or ZnMgO substrate may be in the form for example of a layer of n-type ZnO or ZnMgO generally having a thickness of 100 nm to 100 μm, preferably 50 μm (71). The substrate may also be in the form of a so-called <<bulk>>, "solid", substrate generally having a thickness equal to or more than 100 μm, even 500 μm, for example of 500 μm.

This species having strong chemical affinity for the residual impurities, e.g. lithium, and called a getter species can be chosen either from among theoretically donor impurities preferably from column III of the periodic table of the elements, or from among theoretically acceptor impurities of ZnO or ZnMgO, preferably from column I or V of the periodic table of the elements.

For example, ion multi-implantation of phosphorus can be conducted at energies of 700 keV, 300 keV and 80 keV at a dose of $1^e15$ at/cm$^2$ for each of these energies. Preferably, the getter region is n-type conductive having conductivity at least equal to that of the substrate before the purification step.

The getter region generally consists of a layer of ZnO and/or ZnMgO, generally having a thickness of 10 to 500 nm, for example of 500 nm (72) at the surface of the substrate, or of the thin or thick epitaxied layer.

Step 2 (FIG. 7B):

Diffusion annealing of the impurities such as lithium at high temperature to form the optional chemical phase between the impurities such as lithium and the getter species, and to exo-diffuse the impurities (73) such as lithium and/or hydrogen towards the getter region (72) and the near surface of the material. The annealing which can be envisaged is for example annealing at 1100° C. under O$_2$ flushing for 1 hour.

Step 3A (FIG. 7C):

Growth of thin or thick layers, preferably and respectively by MOCVD, MBE or CVT and/or forming hetero-structures and/or nanowires on the getter layer (72).

It is possible for example to conduct growth of an n-type ZnO layer generally having a thickness of 10 nm to 100 μm, preferably a thickness of 1 to 2 μm, or of multi-quantum wells for example 10×ZnO of 5 nm or ZnMgO of 20 nm (74).

By means of this getter region (72), there is very little or no diffusion (i.e. a concentration of less than $10^{13}$ at/cm$^3$) of lithium into the epitaxied or deposited layers (74).

Step 4 (FIG. 7E):

Doping of layer (74) (in other words introducing a p-type doping species in the layer) obtained at step 3, for example using ion implantation (76) after growth (ex-situ doping) of nitrogen at energies of 200 keV, 120 keV and 50 keV at respective doses of $1^e15$ cm$^{-2}$, $8^e14$ cm$^{-2}$ and $4^e14$ cm$^{-2}$.

It is also possible to carry out in-situ p-doping of the prepared layers, e.g. of the epitaxied or deposited layers, during the growth step 3.

This p-type doping, for example by nitrogen implantation, is generally conducted on a thickness (75) of 100 nm to 1 μm, for example of 500 nm of the ZnO or ZnMgO layer (74) deposited at step 3.

Step 5 (FIG. 7F):

Post-implantation annealing to heal implanting defects and to activate the dopants, acceptors; for example at 900° C. for 15 minutes under O$_2$ flushing.

If doping is performed in-situ, it is also possible to envisage post-growth or in-situ annealing to activate the dopants.

In one variant of this embodiment, it is possible to add a step 2bis (not illustrated) to remove, to eliminate the getter region in which the impurities such as lithium and hydrogen are trapped.

This step 2bis can be performed by gentle mechanical-chemical polishing, for example.

After this step 2bis, a growth step described at step 3B (FIG. 7D) is performed on the n-type ZnO or ZnMgO substrate, that has been purified due to the action of the getter layer.

According to a second embodiment of the preparation method of the invention, in a first variant, the purification and p-type doping of a ZnO or ZnMgO substrate are carried out using a deep gettering technique.

FIG. 8 describes the different steps of this second embodiment of the method:

Step 1 (FIG. 8A):

Ion implantation (83) in an n-type ZnO or ZnMgO substrate (81), of a species having strong chemical affinity for the residual extrinsic impurities, such as lithium, to form what is called a getter region (82), generally in the form of a layer (82).

This step is generally conducted in a similar manner to step 1 of the first embodiment, with the difference that the getter region, generally getter layer, is not a thin surface layer but a <<deep>> layer. By <<deep>> layer is generally meant that this layer has a thickness, depth, equal to or more than 500 nm, preferably of 100 to 1000 nm, for example of 500 nm or 1000 nm, relative to a main surface of the substrate, generally relative to the upper surface of the substrate.

The n-type ZnO or ZnMgO substrate (81) may for example be in the form of a layer of n-type ZnO or ZnMgO having a thickness of 100 nm to 100 µm, preferably of 50 µm.

The substrate may also be in the form of a so-called <<bulk>>, "solid", substrate generally having a thickness equal to or more than 100 µm, even 500 µm, for example of 500 µm.

This species having strong chemical affinity for the residual extrinsic impurities such as lithium, called a <<getter species>> may be chosen either from among theoretically donor impurities, preferably from column III of the periodic table of the elements, or from among theoretically acceptor impurities of ZnO or ZnMgO, preferably from column I or V of the periodic table of the elements.

For example, ion multi-implantation (83) of the getter species such as phosphorus may be performed at energies of 700 keV, 300 keV and 80 keV at a dose of $1^e15$ at/cm$^2$ for each of the energies. Preferably, the getter region is n-type conductive having conductivity at least equal to that of the substrate before the purification step.

The getter region (82) therefore generally consists of a layer, generally of a thickness from 500 to 1000 nm, for example 500 nm or 1000 nm in depth, in the n-type ZnO or ZnMgO substrate, for example in the n-type ZnO or ZnMgO layer.

Step 2 (FIG. 8B):

Diffusion annealing at high temperature of the impurities to form the optional chemical phase between the impurities such as lithium and the getter species and/or to exo-diffuse (84) the impurities such as lithium and/or hydrogen towards the surface of the getter region. The annealing which may be envisaged is for example annealing at 1100° C. under O$_2$ flushing for 1 hour.

In this manner, underneath the getter layer (82), a purified substrate (81) of n-type ZnO or ZnMgO is obtained, over its entire thickness in which the impurities have been eliminated, removed or reduced by means of this getter layer, region (82). At the upper part of the getter layer (82), a surface layer (85) is also obtained generally of a thickness from 10 to 100 nm, for example of 100 nm, made of n-type ZnO or ZnMgO in which the impurities, generally lithium and hydrogen, are trapped and/or, said impurities have concentrations are typically about $10^{13}$ to $10^{14}$ cm$^{-3}$ or lower.

Step 3 (FIG. 8C): p-doping of the surface layer (85) of the region (82) obtained at step 2 (in other words, implanting a doping species in the layer) for example by ion implantation (86) (ex-situ doping) of nitrogen at energies of 200 keV, 120 keV and 50 keV at respective doses of $1^e15$ cm$^{-2}$, $8^e14$ cm$^{-2}$ and $4^e14$ cm$^{-2}$.

Step 4 (FIG. 8D):

Post-implantation annealing to heal implanting defects and to activate the dopants, acceptors; for example at 900° C. for 15 minutes under O$_2$ flushing.

In another variant of this embodiment, it is possible to add a step 2bis to remove, eliminate the getter layer of impurities such as lithium and hydrogen before step 3.

This step 2bis can be performed by gentle mechanical-chemical polishing for example.

According to a second embodiment of the method of the invention in a second variant, the purification and p-doping of a ZnO or ZnMgO substrate are carried out using a surface gettering technique.

FIG. 9 describes the different steps of this second embodiment of the method according to this second variant which uses surface gettering.

Step 1 (FIG. 9A):

Formation of a p-type deep layer (92) in a substrate or layer (91) made of ZnO and/or ZnMgO such as defined above.

By <<deep>> layer is meant that this layer is formed over a large thickness, for example equal to or more than 500 nm, for example from 500 nm to 1000 nm, relative to a main surface of the substrate, generally relative to the upper surface of the substrate.

This layer can be formed either by ion implantation (93) (ex-situ doping) of an acceptor element in the n-type ZnO and/or ZnMgO substrate. Preferably it is an element from column V or I of the periodic table of the elements. Or else, this layer can be formed by in-situ doping i.e. a layer of ZnO and/or ZnMgO is grown by MOCVD for example by adding potentially acceptor dopants during growth.

One practical example would be to carry out nitrogen multi-implantation at energies of 200 keV, 120 keV and 50 keV and respective doses of $1^e15$ cm$^{-2}$, $8^e14$ cm$^{-2}$ and $4^e14$ cm$^{-2}$.

Step 2 (FIG. 9B):

Annealing to heal implantation defects and to activate the acceptors; for example at 900° C. for 15 minutes under oxygen flushing, in particular if the acceptor is nitrogen.

Step 3 (FIG. 9C):

A getter layer is formed in the p-type deep layer.

The formation of this layer may be conducted for example by ion implantation (94) of a species preferably having strong chemical affinity for the residual extrinsic impurities such as lithium, and called a getter species.

This species can be chosen either from among theoretically donor impurities for ZnO and/or ZnMgO, preferably from column III of the periodic table of the elements, or from among theoretically acceptor impurities of ZnO and/or ZnMgO, preferably from column I or V of the periodic table of the elements.

For example, ion multi-implantation of phosphorus may be used at energies of 700 keV, 300 keV and 80 keV and at a dose of $1.10^{15}$ at/cm$^2$ for each of these energies, or else implantation of aluminium at an energy of 80 keV and at a dose of $1.10^{15}$ at/cm$^2$.

Preferably, and if <<vertical>> technology is used, the getter region (95) is n-type conductive having conductivity at least equal to that of the ZnO substrate initially non-implanted and non-annealed.

The getter region (95) generally consists of a layer, generally of thickness 10 to 500 nm, preferably of 100 to 500 nm, for example of 100 nm or 500 nm, from the surface of the p-doped layer.

Step 4 (FIG. 9D):

Diffusion annealing of the impurities is conducted for example at 1100° C. under $O_2$ flushing for 1 hour, to exo-diffuse the residual extrinsic impurities such as lithium and/or hydrogen trapped on the defects and optionally to form a chemical phase. During this step, the impurities such as lithium and hydrogen present in the bulk of the ZnO and/or ZnMgO and in the region of p-type ZnO and/or ZnMgO migrate and are trapped in the getter region and/or are exo-diffused towards the surface. The p-doped region is thus purified by removal of its impurities such as its lithium and its hydrogen.

Step 5 (not Illustrated):

The getter region is optionally removed for example using gentle mechanical-chemical polishing.

To conclude, the purification method used in the present invention allows the efficient purification of a ZnO and/or ZnMgO material by reducing the concentration of highly mobile extrinsic impurities such as lithium and hydrogen.

The main advantage of the method for preparing a p-doped ZnO and/or ZnMgO substrate, comprising at least one purification step of an n-type ZnO and/or ZnMgO substrate used in the invention, is the obtaining of junctions of ZnO and/or ZnMgO by means of a p-doping of the ZnO and/or ZnMgO material. The method of the invention ensures control over this doping i.e. its reproducibility and the obtaining of an intense electroluminescence signal in the UV.

The quality of the p-doping, as demonstrated by high carrier densities and mobilities, is ensured by the substantial reduction in the concentration of impurities such as lithium and hydrogen (preferably donors in ZnO and/or ZnMgO) in the p-type region of commercial ZnO substrates and/or of epitaxied or deposited layers of ZnO and/or ZnMgO on substrates of ZnO and/or ZnMgO.

A device comprising a substrate and/or a thin or thick epitaxied layer at least partly p-doped obtained using the method of the invention both in its first embodiment (FIG. 4A or 4B) and its second embodiment, can be used in optoelectronics to form p-n junctions in particular for the manufacture of light emitting diodes (LEDs). These light emitting diodes can be used for lighting for example, with a low energy consumption.

References

[1] A. Tsukazaki et al., JJAP vol. 44, p L643 (2005).

[2] D. C. Look, Superlattices and Microstructures, vol. 38, p. 406-412 (2005).

[3] B. T. Adekore et al., Journal of Applied Physics, 102, 024908 (2007).

[4] Gu et al., Applied Physics Letters 92, 222109 (2008).

[5] V. A. Perevoschikov and V. D. Skoupov, <<Gettering Defects in Semiconductors>>, Springer Berlin Heidelberg, p. 127 (2005).

[6] T. M. Børseth et al., Phys. Rev. B vol. 77, p 045204 (2008).

[7] T. M. Børseth et al., Superlattices and microstructures, vol. 38, 464 (2005).

[8] W. A. Doolittle et al., Phys. Stat. Sol. A vol. 188, p 491-495 (2001).

[9] J. T. Walton et al., IEEE Transactions of Nuclear Science, vol. 41, p 1031 (1994).

[10] J. Sangster et al., Journal of Phase Equilibria, vol. 16, No 1, p 92 (1995).

The invention claimed is:

1. A method for purifying an n-type ZnO and/or ZnMgO substrate, the process comprising:

introducing a reactive species, having strong chemical affinity for at least one residual extrinsic impurity and/or being capable of creating crystalline defects, in at least one region of a substrate, whereby at least one getter region, capable of trapping the at least one residual extrinsic impurity and/or in which the at least one residual extrinsic impurity is trapped, is created in the substrate; and then annealing the substrate to cause diffusion of the at least one residual extrinsic impurity towards the getter region and/or to outside the getter region.

2. The method according to claim 1, wherein the residual extrinsic impurity is at least one selected from the group consisting of a metal and hydrogen.

3. The method according to claim 2, wherein the residual extrinsic impurity is at least one selected from the group consisting of lithium and hydrogen.

4. The method according to claim 1, wherein the getter region is n- or p-type conductive, or semi-insulating or insulating.

5. The method according to claim 1, wherein the reactive species is introduced in at least one region of the substrate by ion implantation.

6. The method according to claim 1, wherein the getter region is in the form of a layer.

7. The method according to claim 1, wherein the getter region is created at a surface of the substrate.

8. A method for preparing a p-doped ZnO and/or ZnMgO substrate, the method comprising:

introducing at least one reactive species, having strong chemical affinity for at least one residual extrinsic impurity and/or being capable of creating crystalline defects, in at least one region of a substrate, whereby at least one getter region, capable of trapping the at least one residual extrinsic impurity and/or in which the at least one residual extrinsic impurity is trapped, is created in the substrate; and then annealing the substrate to cause diffusion of the at least one residual extrinsic impurity towards the getter region and/or to outside the getter region.

9. The method according to claim 8, wherein the residual extrinsic impurity is at least one selected from the group consisting of a metal and hydrogen.

10. The method according to claim 9, wherein the residual extrinsic impurity is at least one selected from the group consisting of lithium and hydrogen.

11. The method according to claim 8, wherein:

the reactive species is a donor reactive species, an acceptor reactive species, or both; and the getter region is n- or p-type conductive, or semi-insulating or insulating.

12. The method according to claim 11, wherein the reactive species is at least one selected from the group consisting of an element from columns I, III, or V of the periodic table of the elements.

13. The method according to claim 12, wherein the reactive species is at least one selected from the group consisting of phosphorus and aluminium.

14. The method according to claim 8, wherein the at least one reactive species is introduced in at least one region of the substrate by ion implantation.

15. The method according to claim 8, wherein the getter region is in the form of a layer.

16. The method according to claim 8, wherein the getter region is created at a surface of the substrate.

17. The method according to claim 8, comprising:
a) creating the getter region in an n-type ZnO and/or ZnMgO planar substrate, from an upper surface of the substrate;
b) annealing the substrate to cause diffusion of the at least one residual extrinsic impurity, contained in the substrate underneath the getter layer, towards the getter layer;
c) optionally removing the getter layer;
d) depositing an n-type or p-type ZnO and/or ZnMgO on the getter layer or on the substrate from which the getter region has been removed;
e) optionally, if at step d) n-type ZnO and/or ZnMgO has been deposited, p-doping by ion implantation or diffusion of the deposited n-type ZnO and/or ZnMgO; and
optional annealing to heal implantation defects and to activate the p-type dopants of the ZnO and/or ZnMgO.

18. The method according to claim 8, comprising:
a) creating a deep getter layer of thickness equal to or more than 500 nm in a planar n-type ZnO and/or ZnMgO substrate, from an upper surface of a substrate;
b) annealing the substrate on the one hand to cause diffusion of the at least one residual extrinsic impurity contained in the substrate underneath the getter layer towards the getter layer, and annealing on the other hand to reduce the concentration of the at least one residual extrinsic impurity in the upper part of the getter layer close to its upper surface;
c) implanting at least one p-type dopant in the upper part of the getter layer; and
d) optional annealing to heal implantation defects and to activate the p-type dopants of the substrate.

19. The method according to claim 8, comprising:
a) creating, in an n-type ZnO and/or ZnMgO planar substrate, a deep p-type layer having a thickness equal to or more than 500 nm from an upper surface of the substrate;
b) optional annealing to heal implantation defects and to activate the p-type dopants of the substrate;
c) creating a getter layer in the p-type layer from an upper surface of the p-type layer;
d) annealing the substrate to cause diffusion of the residual extrinsic impurities contained in the substrate and in the p-type layer towards the getter layer and to trap the residual extrinsic impurities in the getter layer; and
e) optionally removing the getter layer.

\* \* \* \* \*